US010471479B2

(12) United States Patent
Morioka et al.

(10) Patent No.: US 10,471,479 B2
(45) Date of Patent: Nov. 12, 2019

(54) TREATMENT DEVICE AND EXHAUST SWITCHING DEVICE THEREFOR, AND EXHAUST SWITCHING UNIT AND SWITCHING VALVE BOX (71) Applicants: SCREEN HOLDINGS CO., LTD., Kyoto (JP); Kitz SCT Corporation, Tokyo (JP)

(72) Inventors: Toshihito Morioka, Kyoto (JP); Hideaki Higuchi, Gunma (JP); Toshiaki Iwabuchi, Gunma (JP); Tsutomu Kojima, Gunma (JP)

(73) Assignees: SCREEN HOLDINGS CO., LTD., Kyoto (JP); KITZ SCT CORPORATION, Tokyo (JP)

( * ) Notice: Subject to any disclaimer, the term of this patent is extended or adjusted under 35 U.S.C. 154(b) by 502 days.

(21) Appl. No.: 14/650,998

(22) PCT Filed: Nov. 7, 2013

(86) PCT No.: PCT/JP2013/080116
§ 371 (c)(1),
(2) Date: Jun. 10, 2015

(87) PCT Pub. No.: WO2014/103523
PCT Pub. Date: Jul. 3, 2014

(65) Prior Publication Data
US 2015/0314338 A1 Nov. 5, 2015

(30) Foreign Application Priority Data

Dec. 28, 2012 (JP) ................................ 2012-287946

(51) Int. Cl.
H01L 21/67 (2006.01)
B08B 15/00 (2006.01)
(Continued)

(52) U.S. Cl.
CPC .................. *B08B 3/04* (2013.01); *G03F 7/30* (2013.01); *H01L 21/67017* (2013.01);
(Continued)

(58) Field of Classification Search
CPC ......... H01L 21/67017; H01L 21/67023; H01L 21/67028; H01L 21/67155; H01L 21/6719; B08B 3/04; G03F 7/30
See application file for complete search history.

(56) References Cited

U.S. PATENT DOCUMENTS 4,893,698 A * 1/1990 Suzuki ...................... F02D 9/06
123/323
4,957,139 A * 9/1990 Gwin ...................... F16K 3/029
137/556
(Continued)

FOREIGN PATENT DOCUMENTS

JP 4-72622 6/1992
JP 2002-43272 2/2002
(Continued)

OTHER PUBLICATIONS

International Search Report dated Mar. 4, 2014 in International Application No. PCT/JP2013/080116.

Primary Examiner — Joseph L. Perrin
Assistant Examiner — Irina Graf
(74) Attorney, Agent, or Firm — Wenderoth, Lind & Ponack, L.L.P.

(57) ABSTRACT

A treatment device treats a treatment subject inside a treatment chamber with treatment fluids of a plurality of types. An exhaust switching unit is provided to an exhaust pipe connected to the inside of the treatment chamber, and the exhaust switching unit is formed of a distribution box, switching valve boxes, and an exhaust tube. Additionally, the switching valve boxes, which correspond in number to
(Continued)

the treatment fluids, are connected to the distribution box in a parallel state.

9 Claims, 8 Drawing Sheets

(51) Int. Cl.
*B08B 3/04* (2006.01)
*G03F 7/30* (2006.01)

(52) U.S. Cl.
CPC .... *H01L 21/6719* (2013.01); *H01L 21/67023* (2013.01); *H01L 21/67028* (2013.01); *H01L 21/67155* (2013.01); *Y10T 137/877* (2015.04)

(56) References Cited

U.S. PATENT DOCUMENTS

| | | | | |
|---|---|---|---|---|
| 5,908,657 | A * | 6/1999 | Kimura | B05B 14/00 427/9 |
| 6,656,281 | B1 * | 12/2003 | Ueda | H01L 21/67017 118/50 |
| 2002/0045413 | A1 | 4/2002 | Sotozaki | |
| 2008/0023049 | A1 * | 1/2008 | Matsumoto | H01L 21/67017 134/61 |
| 2009/0116938 | A1 * | 5/2009 | Wakabayashi | F16K 15/03 414/217.1 |
| 2010/0012292 | A1 * | 1/2010 | Yamazaki | C23C 16/4412 165/61 |
| 2010/0040779 | A1 * | 2/2010 | Nagamine | G03F 7/162 427/240 |
| 2011/0308626 | A1 | 12/2011 | Ogata et al. | |
| 2012/0111835 | A1 * | 5/2012 | Ogata | H01L 21/67017 216/83 |
| 2012/0227768 | A1 | 9/2012 | Morita et al. | |

FOREIGN PATENT DOCUMENTS

| | | |
|---|---|---|
| JP | 2011-204933 | 10/2011 |
| JP | 2012-9511 | 1/2012 |
| JP | 2012-190823 | 10/2012 |

* cited by examiner

TREATMENT DEVICE AND EXHAUST SWITCHING DEVICE THEREFOR, AND EXHAUST SWITCHING UNIT AND SWITCHING VALVE BOX

TECHNICAL FIELD OF THE INVENTION

The present invention relates to a treatment device and exhaust switching device therefor, and exhaust switching unit and switching valve box and, in particular, to a treatment device in which treatment subjects as treatment targets include those such as a semiconductor wafer, a liquid-crystal display device substrate, a plasma-display glass substrate, a FED (Field Emission Display) substrate, an optical disk substrate, a magnetic disk substrate, a magneto-optical disk substrate, a photomask substrate, and a solar cell substrate.

BACKGROUND OF THE INVENTION

To manufacture a semiconductor device, a treatment subject such as a semiconductor wafer or a liquid-crystal display panel glass substrate is desired to have a highly-cleaned surface, and therefore a wet treatment is performed on the surface of the treatment subject by using various methods. The wet treatment methods can be broadly classified into a batch type or one-bath type in which a plurality of treatment subjects are simultaneously treated and a single-wafer type in which treatment subjects are treated one by one. In the batch-type treatment, one treatment bath is provided for one treatment chemical solution, and a batch formed of a plurality of treatment subjects are sequentially immersed into each treatment bath for continuous treatment. In the one-bath treatment method, a batch is put into a treatment bath, and injection and discharge of treatment chemical solutions to and from the same treatment bath is repeated to perform treatment. By contrast, in the single-wafer treatment, a treatment chemical solution is supplied for each treatment subject for treatment, and a treatment effect higher than that of the batch-type and one-bath type cleaning can be obtained.

Conventionally, a treatment subject is treated by a batch-type or one-bath-type treatment device excellent in mass production to reduce particles and metal impurities. However, in recent years, with an increase in diameter of the treatment subject and increasing desires for a high degree of cleaning of the surface of the treatment subject after treatment, the single-wafer treatment device, which can obtain a higher treatment effect, has become often used.

As a single-wafer treatment device, there is a rotary treatment device which treats the surface of a treatment subject by supplying a treatment chemical solution while rotating the treatment subject. The treatment device as described above includes a holding member which rotates while holding the treatment subject inside a treatment chamber, and supplies a treatment fluid from a nozzle provided to an upper portion of the treatment chamber to the rotating treatment subject to treat the surface of the treatment subject. The treatment fluid supplied to the surface of the treatment subject goes over the entire surface of the treatment subject by a centrifugal force associated with the rotation of the treatment subject, and is shaken off to the outside and scattered after the surface is treated. Thus, a cup for collecting the scattered treatment fluid is provided on the periphery of the holding member which rotates while holding the treatment subject, and a discharge pipe for discharging the collected treatment fluid to the outside of the treatment chamber is connected to a bottom portion of the cup. Also, during the treatment, clean air is supplied from outside to the inside of the treatment chamber, and the air is discharged to the outside of the treatment chamber from the exhaust pipe provided on a bottom wall of the cup via a gap between the holding member and the cup to discharge vaporized gas or mist of the treatment fluid present inside the cup, thereby preventing particles from being attached to the surface of the treatment subject.

As a treatment fluid in the treatment as described above, an acidic chemical solution, an alkaline chemical solution, an organic solvent, and the like are used, and a treatment chemical solution according to the treatment is selectively supplied to the treatment subject. In this case, the treatment fluids of different types are sequentially supplied to the treatment subject held by the holding member. For example, when an acidic chemical solution is supplied first, an alkaline chemical solution is supplied second, and then an organic solvent is supplied third, exhaust of each treatment fluid is required to be treated in each different exhaust treatment facility. Thus, in the treatment device as described above, exhaust is performed from the treatment chamber via a common exhaust pipe, and then the common exhaust pipe is branched into individual exhaust pipes for the respective treatment fluids discharged from the treatment chamber, thereby allowing the vaporized gas and mist of the treatment fluids discharged from the treatment chamber to be guided to an exhaust treatment facility corresponding to each treatment fluid.

Since the single-wafer treatment device can treat only one treatment subject at one time, the treatment capability per unit time for each treatment device is lower than that of the batch-type treatment device or the like. Thus, a plurality of treatment devices are collectively installed, and a treatment subject is delivered to the treatment chamber of each treatment device by using a common delivery mechanism to perform a concurrent treatment on a plurality of treatment subjects, thereby improving the treatment capability per unit time.

In the treatment device as described above, each individual exhaust pipe branched from the common exhaust pipe of the treatment chamber is connected to a collective exhaust pipe for each same treatment fluid on a downstream side, and a downstream end of this collective exhaust pipe is guided to an exhaust treatment facility applicable for each treatment fluid. Also, each individual exhaust pipe branched from the common exhaust pipe of the treatment chamber is provided with valves, which are opened and closed so as to correspond to the types of treatment fluid supplied to the treatment chamber. For example, when a treatment is performed with an acidic chemical solution, only a valve of the individual exhaust pipe for discharging vaporized gas or mist of the acidic chemical solution is opened, and a valve of the individual exhaust pipe for discharging vaporized gas or mist of other treatment fluids is closed.

Also, in the treatment device as described above, treatments with the same treatment fluid are not necessarily performed in all treatment chambers in synchronization with each other, and it is often the case that different treatments are performed in different treatment chambers. For example, a treatment with an acidic chemical solution is performed in one treatment chamber, a treatment with an alkaline chemical solution is performed in another treatment chamber, and a treatment with an organic solvent is performed in still another treatment chamber. By contrast, since the exhaust amount of the collective exhaust pipe connected to the individual exhaust pipe from each treatment chamber is constant, if the number of treatment chambers communicating with the collective exhaust pipe is changed by opening and closing the valve of the individual exhaust pipe connected to each treatment chamber according to the treatment, the exhaust pressure inside the treatment chamber communicating with the collective exhaust pipe fluctuates.

That is, if the number of treatment chambers communicating with the collective exhaust pipe is decreased, the exhaust pressure inside the treatment chamber communicating with the collective exhaust pipe is increased. If the number of treatment chambers communicating with the collective exhaust pipe is increased, the exhaust pressure inside the treatment chamber communicating with the collective exhaust pipe is decreased. In a conventional treatment device, with these fluctuations in exhaust pressure inside the treatment chamber, there is a problem in which discharge of vaporized gas or mist inside the treatment chamber is insufficient to cause particles to be attached to the surface of the treatment subject. To address this problem, a substrate treatment device of Patent Literature 1 has been suggested.

The above-mentioned literature describes the substrate treatment device in which great fluctuations in exhaust pressure due to the treatment situation in one treatment chamber can be prevented in other treatment chambers and attachment of particles to a wafer associated with fluctuations in exhaust pressure can be inhibited.

In this substrate treatment device, exhaust from a treatment chamber is guided by a common exhaust pipe to an exhaust induction chamber, and is branched via the exhaust induction chamber to each individual exhaust pipe. The exhaust induction chamber is connected via a continuous hole to each individual exhaust pipe. With rotation of a rotating member having an continuous hole provided inside the exhaust induction chamber, a continuous hole communicating with one of the individual exhaust pipes is opened to cause an exhaust communication chamber and the individual exhaust pipe to communicate with each other. Also, each individual exhaust pipe has an open port separately from a communication port with the exhaust communication chamber. By an interrupting member rotating together with the rotating member, the open port of an individual exhaust pipe communicating with the exhaust communication chamber is closed and the open port of an individual exhaust pipe not communicating with the exhaust communication chamber is opened. By introducing air from the opened open port and supplying outside air to the collective exhaust pipe, large fluctuations in exhaust pressure inside another treatment chamber are prevented.

PRIOR ART DOCUMENT

Patent Literature

Patent Literature 1: Japanese Unexamined Patent Application Publication No. 2011-204933

SUMMARY OF THE INVENTION

Problems to be Solved by the Invention

In the substrate treatment device of the above-mentioned literature, the opening area of the switching valve and changes in the exhaust flow amount are large when the exhaust duct is switched. For this reason, the exhaust pressure fluctuates to cause particles, which still poses a problem of contamination of the treatment subject. Moreover, since the structure of the switching valve is a dedicated structure for two-way or three-way switching, standardization cannot be made. Still further, it is required to configure an exhaust switcher by connecting a plurality of individual pipes to communication holes of the exhaust induction chamber. Since this operation is complex, assembling the substrate treatment device is disadvantageously burdensome.

The present invention has been developed to solve the above problems, and has an object of providing a treatment device and exhaust switching device therefor, and exhaust switching unit and switching valve box as described below. That is, an exhaust line is opened and closed with one switching valve, the exhaust amount and the induction amount of an air-side relief valve are balanced, and fluctuations in pressure when the switching valve is activated can be reduced. For two-way, three-way, or other number-way switching using an acidic chemical solution, an alkaline chemical solution, and an organic solvent as treatment fluids, a plurality of individual exhaust pipes are arranged in parallel and, with an operation of opening only one system for exhaust of vaporized gas or mist of the treatment fluid in use for a cleaning treatment and closing the others, fluctuations in pressure inside the treatment chamber can be reduced. Furthermore, components can be standardized.

Means to Solve the Problems

To achieve the object above, an embodiment of the invention provides a treatment device which treats a treatment subject inside a treatment chamber with treatment fluids of a plurality of types, wherein an exhaust switching unit is provided to an exhaust pipe connected to the inside of the treatment chamber, the exhaust switching unit is formed of a distribution box, switching valve boxes, and an exhaust tube, and the switching valve boxes corresponding in number to the treatment fluids are connected to the distribution box in a parallel state.

An embodiment of the invention provides the treatment device, wherein the exhaust switching units connected to a plurality of treatment chambers in a multilayered state individually via a connecting tube are incorporated in a multistage state to configure an exhaust switching device, and the exhaust tube for exhaust of a treatment fluid of a corresponding type is connected to one of the switching valve boxes that is on a same row in the switching valve boxes being in multistage of the exhaust switching device.

An embodiment of the invention provides an exhaust switching device, wherein a distribution box has a connecting part on one side and has a plurality of switching valve boxes connected in a parallel state to another side, the switching valve boxes are each provided with a switching valve which swings in an exhaust direction and a relief valve for introducing air in a direction crossing the exhaust direction, an exhaust tube is provided at an end of the switching valve box in the exhaust direction to configure an exhaust switching unit, and the exhaust switching units are configured in a multilayered state and in multistage with an appropriate holding body.

An embodiment of the invention provides an exhaust switching unit including: a distribution box provided with a connecting tube having a flange for connection of an exhaust pipe on one side and a flange for connection of a switching valve box on another side and having a laterally-elongated rectangular cross section; a switching valve box having a flange to be connected to the distribution box on one side and a flange to be connected to an exhaust tube on another side; and the exhaust tube to be connected to the switching valve box, wherein the switching valve box is provided with a switching valve and a relief valve for air induction.

An embodiment of the invention provides a switching valve box, wherein an air induction duct for air induction is provided in a direction crossing an exhaust direction of a box main body provided with an exhaust duct on a primary side, a swing-type switching valve is provided on an inflow side of the box main body, the exhaust duct and the air induction duct are provided so as to be able to be alternately opened and closed with the switching valve, the induction duct is provided with a shutter which opens and closes a duct opening area, and a swing-type relief valve is provided on an upstream side of the shutter.

An embodiment of the invention provides the switching valve box, wherein the shutter opens and closes, from full-open to full-close, with a two-split plate-shape member being made as being double-doored, to adjust an opening area.

An embodiment of the invention provides the switching valve box, wherein a mist trap is removably disposed on an outflow side of the box main body.

An embodiment of the invention provides the switching valve box, wherein the switching valve is provided rotatably in a range of substantially 90 degrees by a rotary actuator to open and close the switching valve in a swing manner.

Effect of the Invention

According to an embodiment of the invention, the exhaust switching unit configured by connecting the plurality of switching valve boxes corresponding to the types of treatment fluids in a parallel state to the distribution box and connecting the exhaust tube to the plurality of switching valve boxes is connected to the common exhaust pipe connected to the inside of the treatment chamber to configure the treatment device. Therefore, only one system for discharging vaporized gas or mist of the treatment fluid from the treatment chamber performing a cleaning treatment is opened, and the other systems can be closed. Thus, it is possible to achieve a treatment device capable of reducing fluctuations in exhaust pressure inside the treatment chamber when the switching valve is activated and preventing attachment of particles onto the surface of the treatment subject. Also, the switching valve boxes are standardized with the same structure, and the plurality of switching valve boxes corresponding to the types of treatment fluids are connected in a parallel state to configure an exhaust switching unit. Therefore, cost of manufacturing the treatment device can be reduced, and easy assembling and excellent workability can be provided.

According to an embodiment of the invention, the exhaust switching device in which the exhaust switching units are incorporated in multistage in the plurality of treatment chambers in a multilayered state and the exhaust tube for exhaust of a treatment fluid of a corresponding type is connected to a switching valve box that is on a same row is connected via an individual common exhaust pipe to configure the treatment device. Therefore, the treatment device with large treatment capability can be easily configured in an effectively-utilized small space.

According to an embodiment of the invention, a distribution box has a connecting part to the common exhaust pipe on one side and has a plurality of switching valve boxes connected to the other side of the distribution box in a parallel state, the switching valve boxes each including a switching valve for opening and closing the exhaust duct, and the switching valve and a relief valve for air induction and the exhaust tube is connected to the end of the switching valve box in the exhaust direction, thereby configuring an exhaust switching unit capable of preventing fluctuations in exhaust pressure when switching to a valve corresponding to one treatment chamber is made. By holding this exhaust switching units are held with an appropriate holding body in a multilayered state and in multistage, the exhaust switching device for supporting the plurality of treatment chambers arranged in a multilayered state and in multistage can be easily configured. Also, the exhaust switching device having the exhaust switching units held by the appropriate holding body in a multilayered state and in multistage is prepared in advance, brought to a treatment device assembly site, and connected to the plurality of treatment chambers arranged in a multilayered state and in multistage, thereby greatly facilitating assembling of the treatment device. Furthermore, by increasing the number of multilayered stages for the holding body to increase the number of treatment chambers and exhaust switching devices, treatment capability of the treatment device can be further improved with ease.

According to an embodiment of the invention, to configure an exhaust system for discharging exhaust to the outside of the treatment device for each type of treatment fluids for use in the treatment chamber, only by connecting the distribution box, the plurality of switching valve boxes according to the types of treatment fluids, and exhaust tubes corresponding to the respective switching valve boxes together with flanges provided to the respective components, an exhaust switching unit which discharges exhaust from the treatment chamber for each type of treatment fluid can be easily configured without performing a complex piping operation. Also, since the distribution box has a rectangular cross section, a large channel cross-sectional area can be ensured even with a small size. Also, easy handling and configuration of the exhaust switching device are achieved. The switching valve box includes the switching valve which alternately opens and closes the exhaust duct and the air induction duct and the relief valve for air induction. Therefore, the relief valve for air induction opens and closes according to the opening and closing of the switching valve to introduce air. Thus, it is possible to prevent fluctuations in exhaust pressure inside the other treatment chambers connected to the exhaust tube to which the switching valve box is connected.

According to an embodiment of the invention, the swing-type switching valve which opens and closes the exhaust duct is provided on an inflow side of the switching valve box, and the duct for air induction is provided in a direction crossing the exhaust direction of the box main body. Also, a relief valve for air induction is provided at a position outside the duct. Thus, the exhaust duct can be opened and closed with the switching valve according to the treatment situation inside the treatment chamber. In addition, when the switching valve is positioned to close the exhaust channel, the inside of the switching valve box becomes under negative pressure due to suction by the exhaust tube to cause the relief valve to automatically open inwardly to introduce air inside. Thus, by appropriately adjusting the opening area of the shutter provided to the air induction duct, the amount of air equal to that when the switching valve opens the exhaust channel can be taken from the air induction duct for supply to the exhaust tube, and it is possible to prevent fluctuations in exhaust pressure inside the other treatment chambers connected to the exhaust tube to which the switching valve box is connected. Furthermore, when the switching valve is positioned to open the exhaust duct according to the treatment situation inside the treatment chamber, the air induction duct is closed with the switching valve, and therefore the relief valve becomes uninfluenced by negative pressure due to suction by the exhaust tube and automatically stops air intake. Therefore, only the exhaust from the treatment chamber is supplied to the exhaust tube, and it is possible to prevent fluctuations in exhaust pressure inside the other treatment chambers connected to the exhaust tube to which the switching valve box is connected.

According to an embodiment of the invention, by changing the degree of opening of the two-split plate-shaped member of the shutter to adjust the opening area of the air induction duct, when the switching valve is positioned to close the exhaust channel, the air induction amount to be taken from the relief valve for air induction into the inside of the switching valve box is adjusted so as to be equal to the exhaust amount when the switching valve is positioned to open the exhaust channel according to the exhaust amount or according to an entire exhaust balance. Thus, it is possible to prevent fluctuations in exhaust pressure inside the other treatment chambers connected to the exhaust tube to which the switching valve box is connected.

According to an embodiment of the invention, the mist of the treatment fluid discharged together with the exhaust of the treatment fluid from the inside of the treatment chamber can be separated from the exhaust of the treatment fluid and scavenged to the inside of the switching valve box. Therefore, the mist of the treatment fluid does not reach downstream of the switching valve box, and a maintenance operation of the treatment device is facilitated. Also, when the switching valve swings, an intermediate channel larger than the channel area of each of the exhaust duct and the air induction duct is formed of the switching valve and the mist trap. With this, changes in the amount of flow inside the switching valve box are reduced, and it is possible to prevent fluctuations in exhaust pressure inside the treatment chamber to which the switching valve box is connected.

According to an embodiment of the invention of, the switching valve is rotated at substantially 90 degrees by the rotary actuator to alternately open and close the exhaust duct and the air induction duct. When the exhaust duct is opened to let exhaust flow, the air induction duct is closed and air is not introduced. When the exhaust duct is closed to prevent flowing of exhaust, the air induction duct is opened to introduce air. With this, the exhaust amount flowing through the switching valve box and the air induction amount are balanced, and it is possible to prevent fluctuations in exhaust pressure inside the other treatment chambers connected to the exhaust tube to which the switching valve box is connected.

DESCRIPTIONS OF THE PREFERRED EMBODIMENTS

Figure 1:
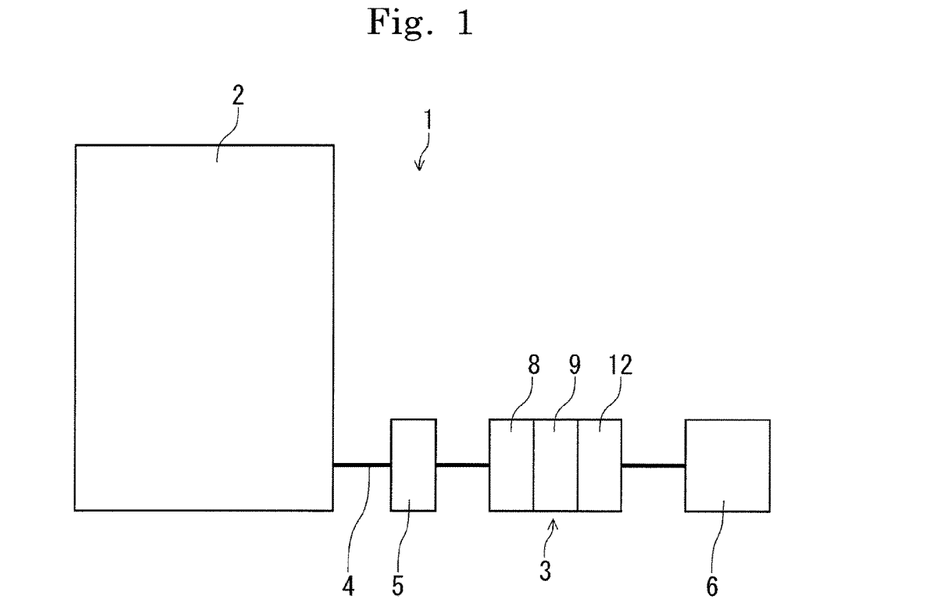
FIG. 1 is a schematic view depicting the structure of a treatment device in the present invention.

In the following, an embodiment of the present invention when, for example, a semiconductor wafer is cleaned is described in detail based on the drawings. FIG. 1 conceptually depicts the structure of a treatment device 1 in the present invention. The treatment device 1 is a device for cleaning surfaces of semiconductor wafers, one by one, by using an acidic chemical solution, an alkaline chemical solution, and an organic solvent as treatment fluids to remove impurities.

The treatment device 1 is configured to have a treatment chamber (chamber) 2 for cleaning a semiconductor wafer and an exhaust switching unit 3 for switching a discharge destination of exhaust from the treatment chamber 2 according to a treatment fluid for use in the treatment chamber 2 connected to each other via a common exhaust pipe 4. Also, a gas-liquid separator 5 is provided in the middle of the exhaust pipe 4 to separate a treatment fluid contained in the exhaust from the treatment chamber 2. The exhaust passing via the exhaust switching unit 3 is sent to an exhaust treatment facility 6 for treatment.

Figure 2:
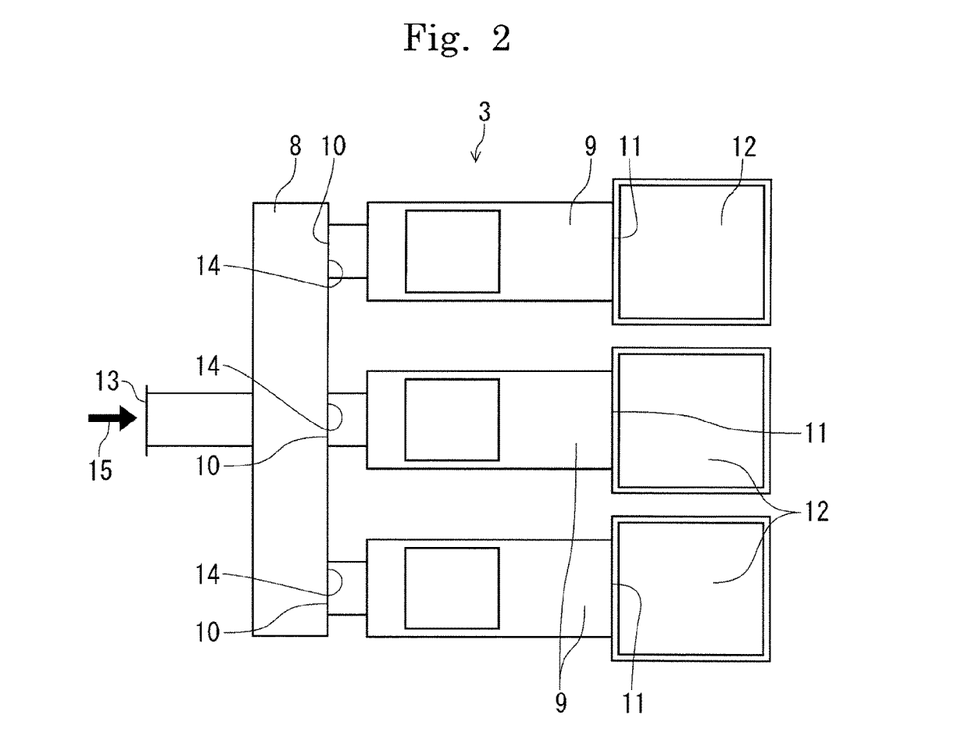
FIG. 2 is a schematic view depicting a plane of an exhaust switching device in the present invention.
Figure 3:
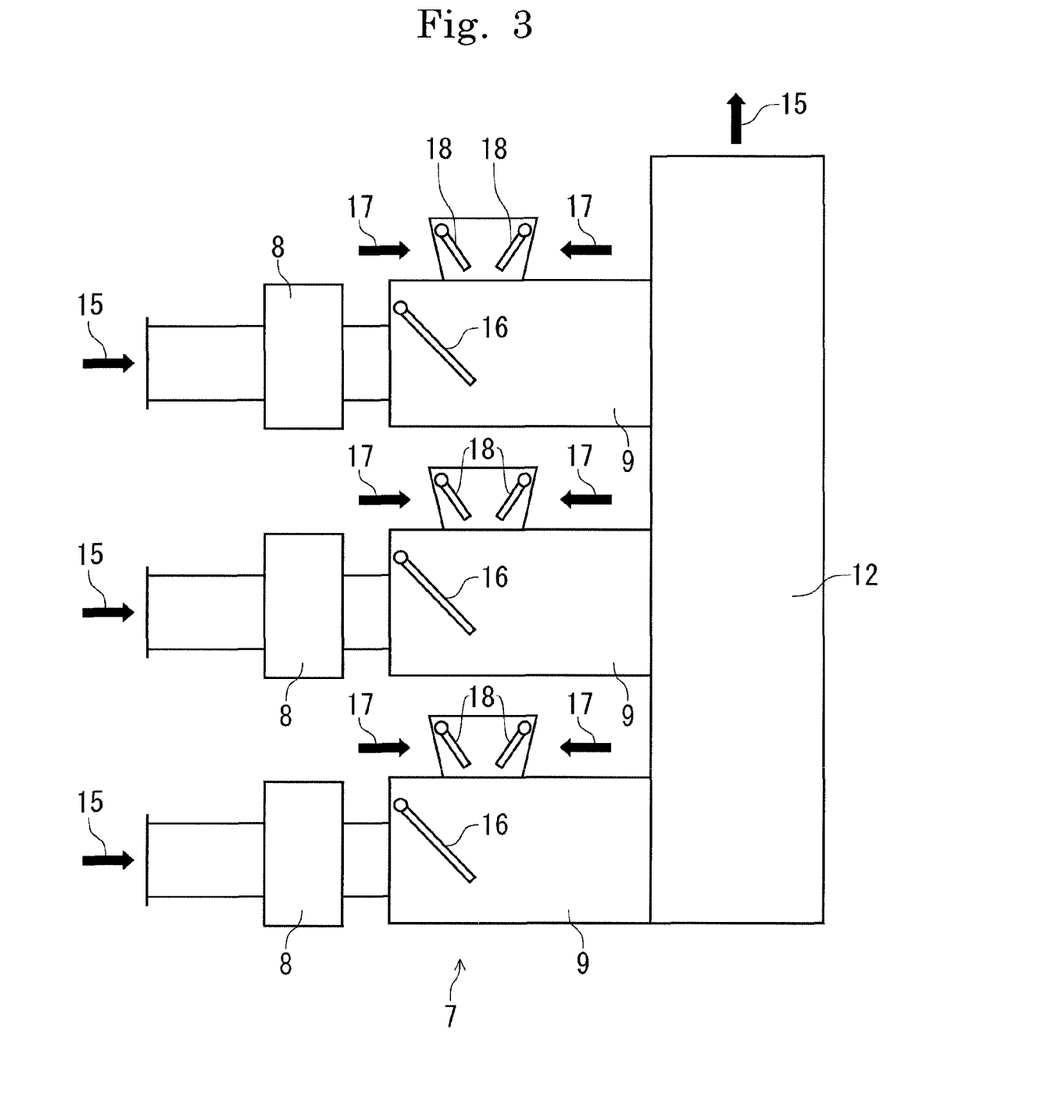
FIG. 3 is a schematic view depicting a side cross-section of the exhaust switching device.

FIG. 2 schematically depicts the configuration of the exhaust switching unit 3 viewed from its upper surface, and FIG. 3 schematically depicts a side cross-sectional view of an exhaust switching device 7 having the exhaust switching units 3 incorporated in a multistage state. The exhaust switching unit 3 in the present embodiment is formed of a resin material and manufactured as being transparent or translucent so as to allow the inside of the unit 3 to be checked.

As depicted in FIG. 2, the exhaust switching unit 3 has a plurality of switching valve boxes 9 corresponding to the types of treatment fluids connected in a parallel state to a distribution box 8, and is configured with an exhaust tube 12 connected to an end 11 of each switching valve box 9 opposite to an end 10 on a side connected to the distribution box 8.

The distribution box 8 is configured to have a laterally-elongated rectangular cross section, has a connecting part 13 on one side connected to the exhaust pipe 4 and a connecting part 14 on the other side having the plurality of switching valve boxes 9 corresponding to the types of treatment fluids for use connected in a parallel state. Since the distribution box 8 is configured to have a rectangular cross section, compared with the case in which the distribution box 8 is configured to have a circular cross section, a larger channel cross section can be ensured when the outer dimensions are the same, and also easy handling and simple configuration of the exhaust switching unit 3 are achieved. Furthermore, the distribution box 8 has a channel communicating the connecting part 13 and the plurality of connecting parts 14, allowing exhaust 15 introduced from the treatment chamber 2 via the exhaust pipe 4 to be guided to each switching valve box 9.

The switching valve box 9 is provided inside with, as depicted in FIG. 3, a switching valve 16 which swings in an exhaust direction and relief valves 18 which introduce air 17 in a direction crossing the exhaust direction, with one end 10 on one side connected to the connecting part 14 of the distribution box 8 and the end 11 in the exhaust direction connected to the exhaust tube 12.

The exhaust tube 12 guides the exhaust 15 supplied from the connected switching valve box 9 to the exhaust treatment facility 6 not depicted.

In the above-structured exhaust switching unit 3, the exhaust 15 from the treatment chamber 2 reaches the plurality of switching valve boxes 9 connected in a parallel state to the distribution box 8. However, since the switching valve 16 of the switching valve box 9 corresponding to a treatment fluid not used inside the treatment chamber 2 is positioned to close the flow of exhaust, the exhaust 15 cannot flow into that switching valve box 9. On the other hand, since the switching valve 16 of the switching valve box 9 corresponding to a treatment fluid being used inside the treatment chamber 2 is positioned to open the flow of exhaust, the exhaust 15 flows into that switching valve box 9 to be guided via the exhaust tube 12 connected to that switching valve box 9 to the exhaust treatment facility 6 for that treatment fluid.

Also, in the switching valve box 9 where the switching valve 16 is positioned to close the exhaust channel, the exhaust 15 from the treatment chamber 2 is interrupted, and the air inside the switching valve box 9 is suctioned by the exhaust tube 12, thereby putting the inside of the switching valve box 9 under negative pressure. Therefore, the relief valves 18 are automatically opened by atmospheric pressure, and the air 17 is introduced into the inside of the switching valve box 9 for supply to the exhaust tube 12.

The exhaust switching unit 3 can be configured if the switching valve boxes 9 having the same configuration are connected in a parallel state to the distribution box 8 so as to correspond in number to the types of treatment fluids. Therefore, assembling workability is excellent, and standardization of components can reduce device-manufacturing cost.

Since the exhaust switching device 7 depicted in FIG. 3 is configured with the exhaust switching units 3 incorporated in a multistage state, the exhaust tube 12 for exhaust of the treatment fluid of a corresponding type is connected to the switching valve box 9 on the same row, and the exhaust tube 12 is integrated for each treatment fluid of the corresponding type for configuration. With this configuration, the number of exhaust tubes for use in the exhaust switching device 7 can be reduced, and the exhaust switching device 7 can be configured to be made compact.

Figure 4:
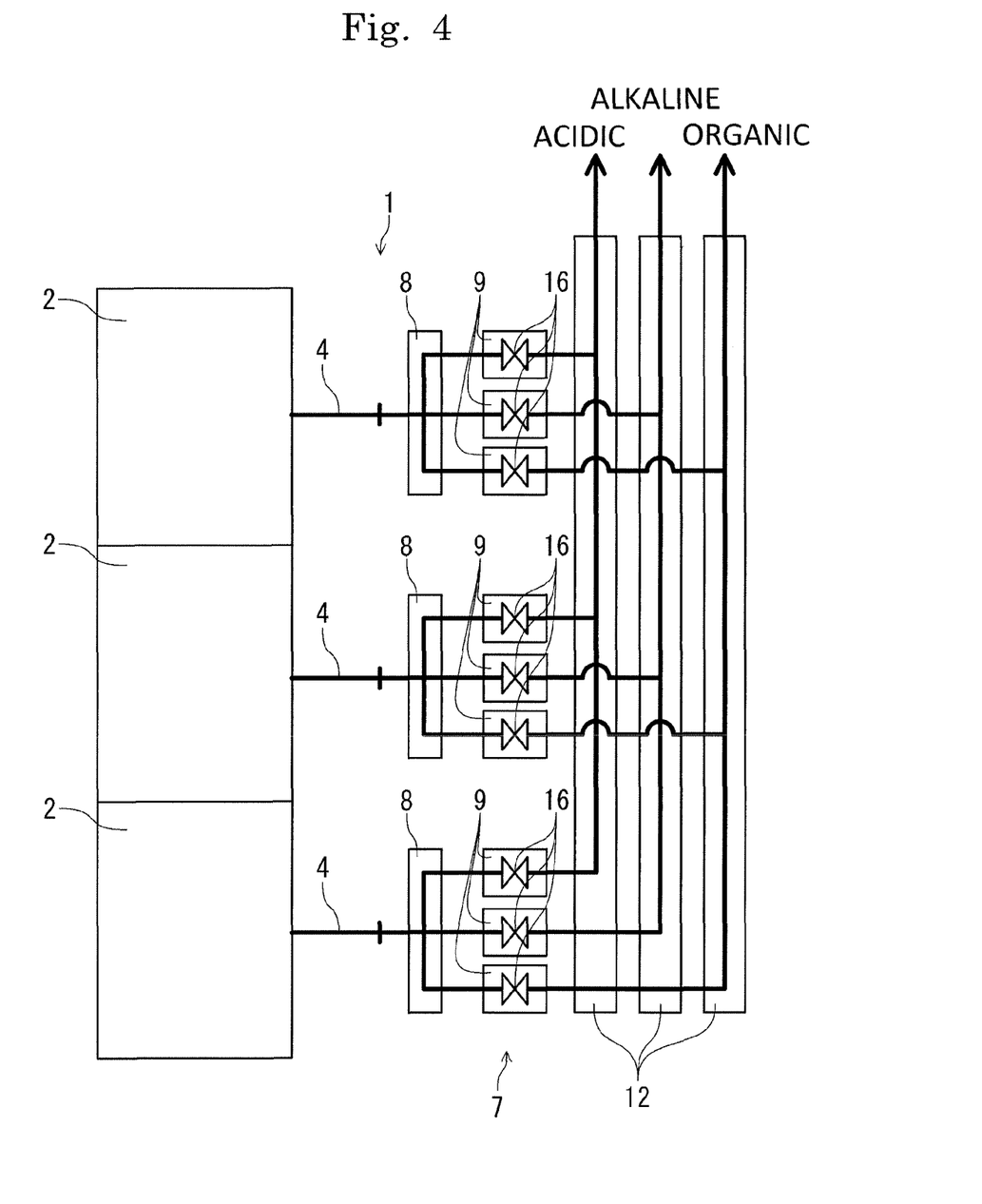
FIG. 4 is an explanatory diagram depicting an exhaust system of the exhaust switching device.

FIG. 4 schematically depicts an exhaust system of the treatment device 1 configured by connecting the exhaust switching device 7 configured by incorporating the exhaust switching units 3 in a multistage state to the plurality of treatment chambers 2 in a multilayered state each individually via the exhaust pipe 4. In this drawing, the exhaust switching units 3 for three-system exhaust where three types of treatment fluids are used, that is, an acidic chemical solution, an alkaline chemical solution, and an organic solvent, is depicted as an example. Exhaust from the treatment chamber 2 is supplied by each distribution box 8 to three switching valve boxes 9 connected in a parallel state to that distribution box 8. Here, when it is assumed that a cleaning treatment using an acidic chemical solution is being performed inside the uppermost stage of the treatment chamber 2, the switching valve 16 inside the switching valve box 9 connected to the exhaust tube 12 for treating acidic exhaust is positioned to open the flow of exhaust, and the switching valve 16 inside the switching valve box 9 connected to the exhaust tube 12 for treating alkaline exhaust is positioned to close the flow of exhaust and the switching valve 16 inside the switching valve box 9 connected to the exhaust tube 12 for treating organic exhaust is also positioned to close the flow of exhaust. When the cleaning treatment using the acidic chemical solution ends and proceeds to a cleaning treatment using the alkaline chemical solution, the switching valve 16 inside the switching valve box 9 connected to the exhaust tube 12 for treating acidic exhaust is positioned to close the exhaust, and the switching valve 16 inside the switching valve box 9 connected to the exhaust tube 12 for treating alkaline exhaust becomes positioned to open the flow of exhaust. As such, by the exhaust switching unit 3 switching the exhaust system, the exhaust from the treatment chamber 2 can be reliably guided to the exhaust treatment facility 6 suitable for a treatment of that treatment fluid and can be appropriately treated.

Also, as depicted in the drawing, the exhaust 15 from each treatment chamber 2 is branched via the exhaust switching unit 3, with the exhaust of the acidic chemical solution to the exhaust tube 12 for the acidic chemical solution, the exhaust of the alkaline chemical solution to the exhaust tube 12 for the alkaline chemical solution, and the exhaust of the organic solvent to the exhaust tube 12 for the organic solvent. Therefore, it is not required to provide the exhaust tubes 12 so as to correspond in number to the types of the treatment fluids for use for each treatment chamber 2, and installation of the exhaust tubes 12 so as to correspond in number to the types of the treatment fluids for use for each unit incorporated in the plurality of treatment chambers 2 in a multistage manner suffice. Therefore, manufacturing cost of the treatment device can be reduced, and the treatment device can be configured in an effectively-utilized small space.

Furthermore, as depicted in FIG. 3, the switching valve box 9 is provided with the relief valves 18. When the switching valve 16 is positioned to close the flow of the exhaust, the relief valves 18 are opened by negative pressure due to suction by the exhaust tube 12, and the air 17 is introduced to the inside of the switching valve box 9 to flow to the exhaust tube 12. As described above, when cleaning procedures are performed with the acidic chemical solution in the treatment chamber 2 on the uppermost stage depicted in the drawing while treatments with other treatment fluids are performed in the treatment chambers 2, 2, on the intermediate and lower stages, the switching valves 16, 16 of the switching valve boxes 9, 9 not connected to the exhaust tube 12 for treating the acidic exhaust are positioned to close the flow of exhaust. Therefore, here, the treatment chamber 2 communicating with the exhaust tube 12 is only the treatment chamber 2 connected to the switching valve box 9 of the exhaust switching unit 3 on the uppermost stage. On the other hand, since the exhaust amount of the exhaust tube 12 is constant irrespective of the number of communicating treatment chambers, it can be thought that a larger negative pressure act on the treatment chamber 2 on the uppermost stage than that when the treatment chambers 2, 2 on the intermediate and lower stages are also connected to the exhaust tube 12 for treating acidic exhaust. However, as described above, in the switching valve boxes 9, 9 on the intermediate and lower stages, the relief valves 18, 18 are opened to introduce the air, which is let flow to the exhaust tube 12 for treating acidic exhaust. Therefore, the amount of flow flowing through the exhaust tube 12 is always constant, a large negative pressure due to suction by the exhaust tube 12 does not act on the inside of the treatment chamber 2 on the uppermost stage.

Figure 5:
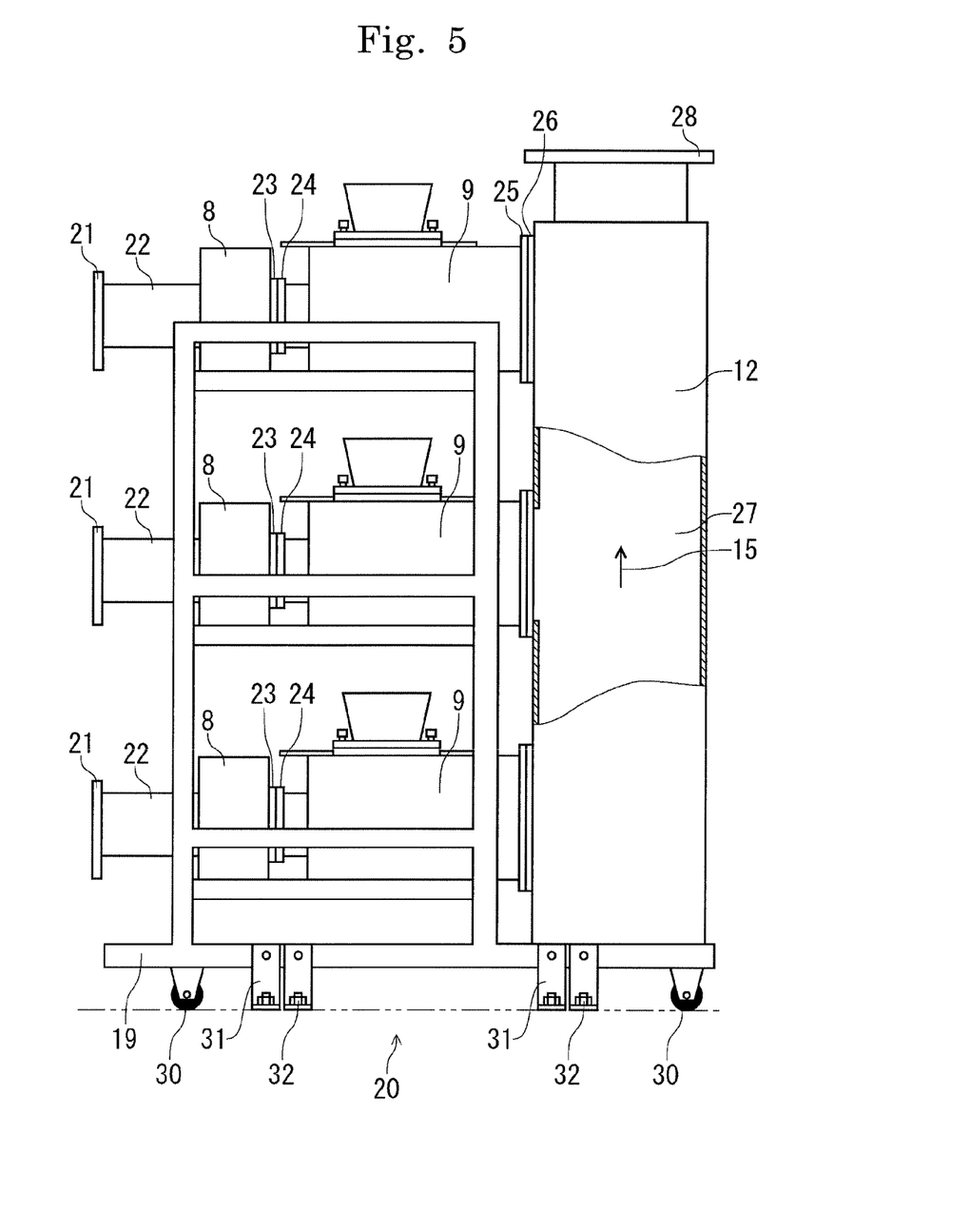
FIG. 5 is a side view when exhaust units in the present invention are incorporated in a holding body so as to be in a layered state to configure the exhaust switching device.
Figure 6:
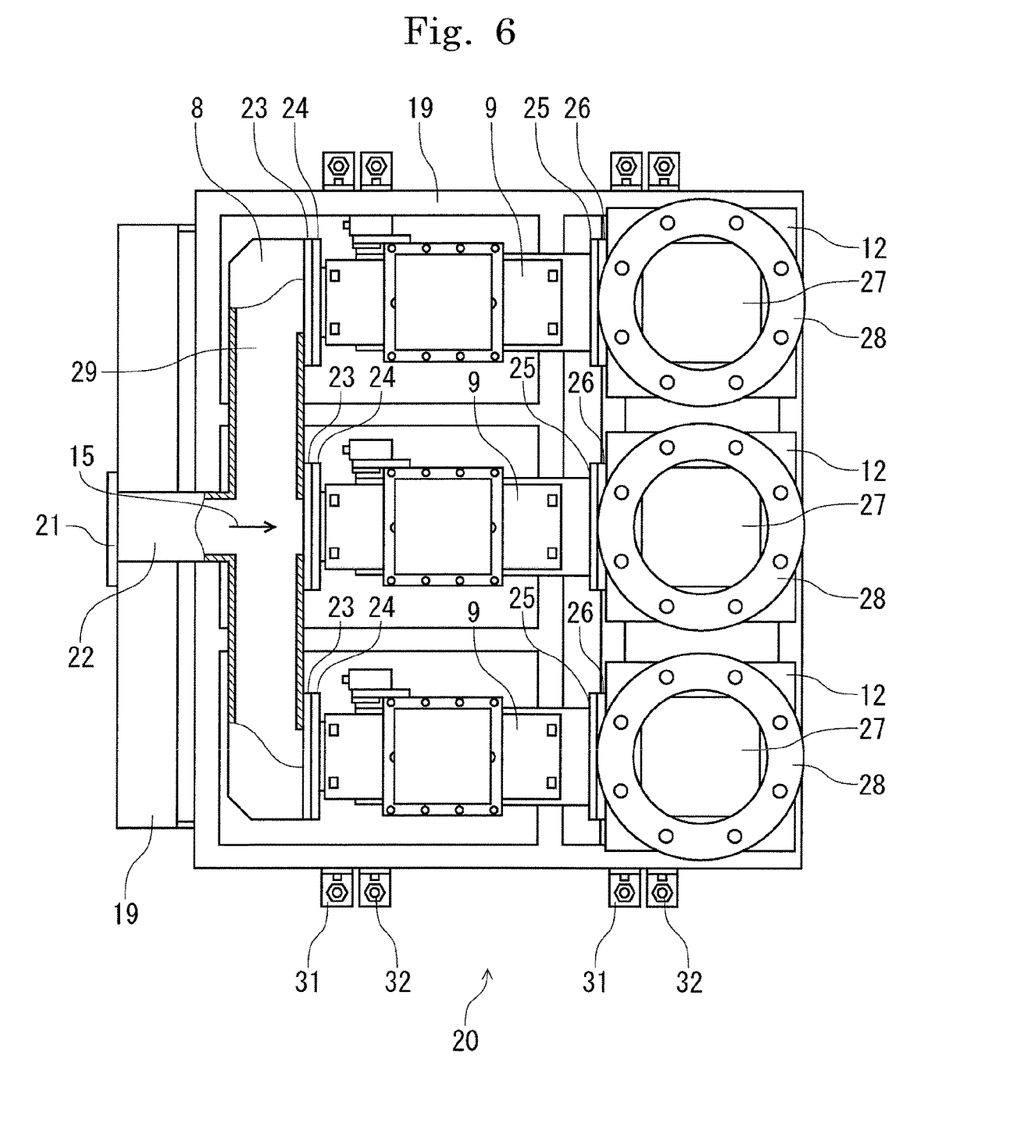
FIG. 6 is a plan view when the exhaust units are incorporated in the holding body so as to be in a layered state to configure the exhaust switching device.

FIG. 5 is a side view of an exhaust switching device 20 in which the exhaust switching units 3 are configured in a multilayered state and in multistage with a holding body 19, and FIG. 6 is a plan view of the exhaust switching device 20. As depicted in FIG. 5, the exhaust switching unit 3 on each stage in the exhaust switching device 20 is configured to have a distribution box 8 provided with a connecting tube 22 having a flange 21 for connection to the exhaust pipe 4 on one side and a flange 23 for connection to the switching valve box 9 on the other side, a switching valve box 9 provided with a flange 24 for connection to the distribution box 8 on one side and a flange 25 for connection to the exhaust tube 12 on the other side, and the exhaust tube 12 having a flange 26 for connection to the switching valve box 9. Note that instead of providing exhaust tubes 12 for respective stages individually, an exhaust tube for exhaust of a corresponding type of a treatment fluid is connected to the switching valve box 9 on the same row in a longitudinal direction for integration, and an inner channel 27 communicates in a vertical direction. On an upper portion of the exhaust tube 12, a flange 28 for connection to a pipe (not depicted in the drawing) for guiding exhaust to the exhaust treatment facility 6 is provided. Also, as depicted in FIG. 6, an inner channel 29 in the distribution box 8 communicates in a lateral direction, allowing the exhaust 15 to be guided to the plurality of switching valve boxes 9 connected in a parallel state.

Since having the exhaust switching units 3 multilayered in multistage with the holding body 19, the exhaust switching device 20 is excellent in strength and stability. While the holding body 19 can have any material and shape, the holding body 19 can be manufactured by welding or bolting an equilateral-angle or inequilateral-angle steel with appropriate dimensions. By previously manufacturing and preparing the exhaust switching device 20 with the exhaust switching units 3 configured in a multilayered state and in multistage with the holding body 19 as described above, the treatment device can be assembled within a short period of time. Also, as depicted in FIG. 5, if casters 30 are mounted on a lower portion of the holding body 19, the exhaust switching device 20 can be easily moved. Furthermore, if mount fittings 31 are mounted on a lower portion of the holding body 19 so that the device can be fixed with bolts 32 to the floor surface of an installation place, the exhaust switching device 20 can be reliably fixed onto the floor surface for stabilization when used in the semiconductor manufacturing scene.

Figure 7:
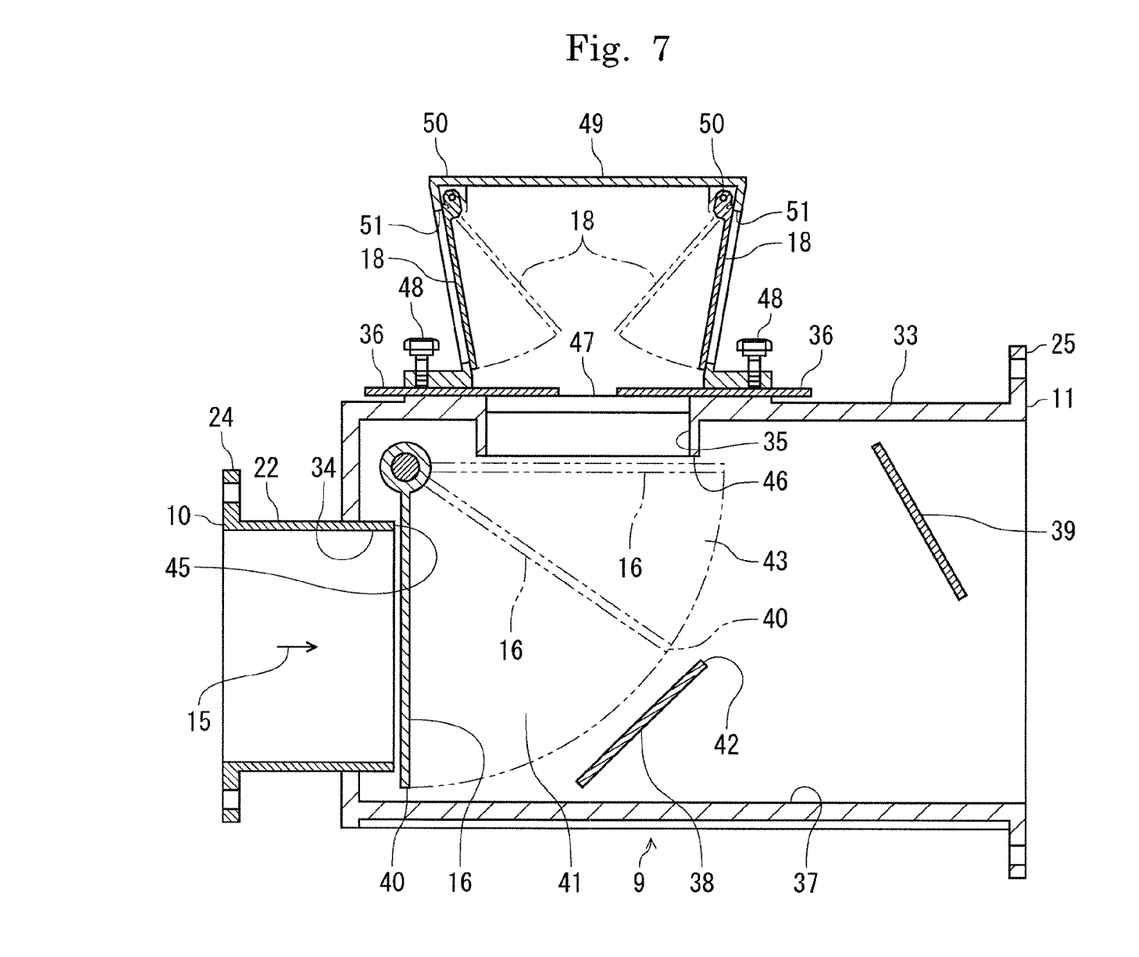
FIG. 7 is a longitudinal sectional view of a switching valve box in the present invention.
Figure 8:
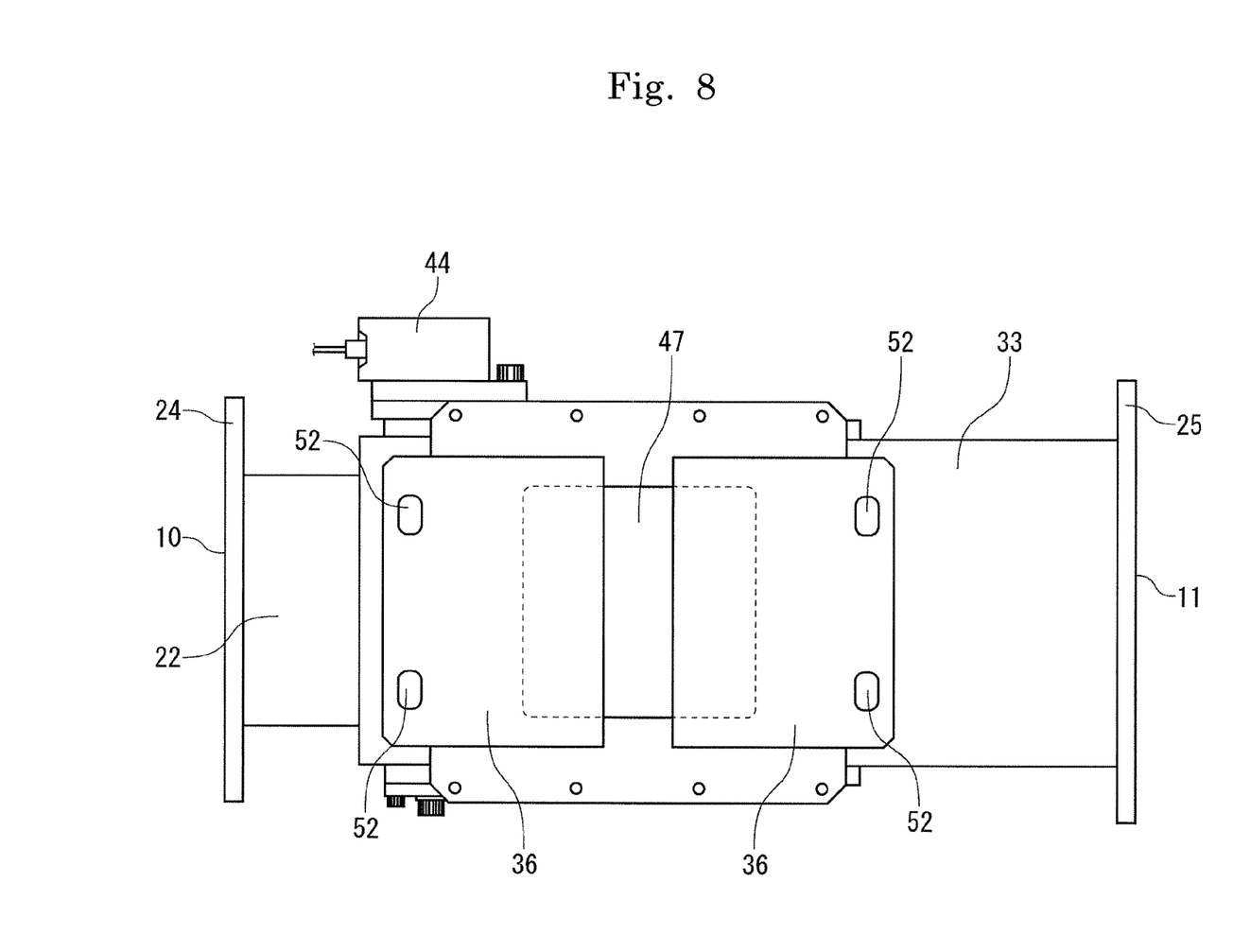
FIG. 8 is a plan view when components of the switching valve box are partially removed.

FIG. 7 is a longitudinal sectional view of the switching valve box in the present invention, and FIG. 8 is a plan view thereof. The switching valve box 9 is provided with an exhaust duct 34 on a primary side of a box main body 33 in a rectangular cross section and an air induction duct 35 for air induction in a direction crossing an exhaust direction of the box main body 33. On an inflow side of the box main body 33, a swing-type switching valve 16 which can alternately open and close the exhaust duct 34 and the air induction duct 35 is provided. The air induction duct 35 is provided with shutters 36 which open and close a duct opening area with a two-split plate-shaped member. Also, a paired swing-type relief valves 18, 18 are provided on an upstream side of the shutters 36. Furthermore, the box main body 33 has a bottom surface 37 formed so as to be tilted, thereby collecting mist of the treatment fluid scavenged by mist traps, which will be described further below, to the end 11 of the switching valve box 9 on the side connected to the exhaust tube 12 for easy collection. Since the box main body 33 is formed in a rectangular cross section, it is possible to ensure an inner channel area larger than that when the box main body 33 is formed in a cylindrical shape, and manufacture and handling are easy.

At an end of the exhaust duct 34 on an upstream side, the flange 24 for connection to the flange 23 of the distribution box 8 is provided. At an end of the box main body 33 on a downstream side, the flange 25 for connection to the flange 26 of the exhaust tube 12 is provided. With these flanges 24 and 25, the switching valve box 9 can be mounted on the distribution box 8 and the exhaust tube 12 to configure the exhaust switching unit 3.

Also, inside the box main body 33, mist traps 38 and 39 which separate mist and exhaust contained in the exhaust 15 flowing into the switching valve box 9 are removably provided. The mist trap 38 is provided so as to not simply separate mist contained in the exhaust but also form an intermediate channel 41 between the mist trap 38 and a tip end 40 of the swinging switching valve 16, the intermediate channel 41 continuous from the exhaust duct 34 and larger than the channel area of the exhaust duct 34, but also form an intermediate channel 43 having a larger channel area than that of the exhaust duct 34 or the intermediate channel 41 when the switching valve 16 is activated to go over an upper end 42 of the mist trap 38. Thus, when the switching valve 16 swings to open and close the exhaust duct 34 or the air induction duct 35, changes in channel areas on an open side and a closed side are reduced, thereby decreasing changes in the amount of flow of the exhaust or induction air inside the switching valve box 9 due to an opening/closing operation of the switching valve 16 and inhibiting fluctuations in exhaust pressure inside the treatment chamber 2.

The switching valve 16 freely swings at substantially 90 degrees for approximately one second by a rotary actuator 44 provided to an external side surface of the box main body 33 to open and close an exit 45 of the exhaust duct 34 and an exit 46 of the air induction duct 35. Thus, when the exit 45 of the exhaust duct 34 is open, the switching valve 16 is positioned to close the exit 46 of the air induction duct 35, and the exhaust 15 from the treatment chamber 2 flows into the inside of the box main body 33 to be discharged to the exhaust tube 12. When the switching valve 16 swings at approximately 90 degrees by the rotary actuator 44 to close the exit 45 of the exhaust duct 34, the exit 46 of the air induction duct 35 is open, and the relief valves 18 swing inwardly by a negative pressure due to suction by the exhaust tube 12, and the air flows into the inside of the box main body 33 and is discharged to the exhaust tube 12. Note that even when the switching valve 16 is positioned to close the exit 45 of the exhaust duct 34 or the exit 46 of the air induction duct 35, the exit 45 or the exit 46 is not completely closed by the switching valve 16. In this example, a gap on the order of 4 mm is provided between the switching valve 16 and the exit 45 or the exit 46. Also, since no sealing material is provided to the exit 45 and the exit 46, exhaust is always made to some amount.

The rotary actuator 44 depicted in FIG. 8 performs operation of rotating the switching valve 16 under the control of a sequencer not depicted in the drawing or the like to alternately open and close the exit 45 of the exhaust duct 34 and the exit 46 of the air induction duct 35 in the switching valve box 9 in consideration of timing of treatment of the treatment subject in the treatment chamber 2.

To allow the same amount of air as the amount of exhaust from the exhaust duct 34 to be introduced to the inside of the switching valve box 9 with the switching valve 16 closing the exit 45 of the exhaust duct 34, the air induction duct 35 has a channel area equivalent to that of the exhaust duct 34.

Also, the shutters 36 provided to adjust the area of a duct opening 41 of the air induction duct 35 are double-doored with a two-split plate-shaped member, thereby adjusting the channel area of the air induction duct 35 in a range of 0 to 100% and allowing adjustment of the amount of air induction. After the channel area is adjusted, the shutters 36 can be pressed and fixed with fastening bolts 48 onto an upper outer surface of the box main body 33.

The relief valves 18 each have an upper portion mounted as being axially and rotatably attached with a mount shaft 50 to the inside of an air induction box 49 provided on an upper portion of the box main body 33 so as to cover the air induction duct 35, and therefore easily swing by wind pressure received from introduced air. The air induction box 49 has a cross sectional shape of an inverted trapezoidal shape so that the swing-type relief valves 18 without an actuator can automatically close the air intake ports 51. With the air induction box 49 formed in an inverted trapezoidal cross sectional shape and the relief valves 18 rotatably and axially attached inside, when air is not introduced from the air intake ports 51, the relief valves 18 are about to each rotate to a position straight below the mount shaft 50 by the action of gravity. Therefore, the air intake ports 51 are automatically closed.

As such, since each relief valves 18 are positioned to close air intake ports 51 as being in a tilted state, gravity always acts on the relief valves 18 so that the relief valves 18 are rotated in a valve closing direction. Therefore, when air is introduced, valve-open resistance occurs. Thus, to allow induction of a large flow amount when air is introduced, the air induction box 49 is provided with two sets of the relief valve 18 and the air intake port 51 so that a total of two opening areas formed of the relief valves 18, 18 and the air intake ports 51, 51 is equal to the channel area of the air induction duct 35, thereby reducing a pressure drop. In the present embodiment, when the relief valves 18 are opened at approximately 30 degrees of valve opening, the total of two opening areas formed of the relief valves 18 and the air intake ports 51 is approximately equal to the channel area of the air induction duct 35.

Note that when only one air intake port is provided and its area is set so as to be equivalent to the channel area of the air induction duct, the relief valve is required to be opened at 90 degrees of valve opening. With wind pressure at the time of air induction, the relief valve cannot be opened to that angle. Moreover, when one set of a relief valve and an air intake port is provided, the area of the air intake port is required to be doubled, inviting an increase in size of the device.

FIG. 8 is a plan view of the switching valve box 9 with the air induction box 49 removed therefrom. On the upper portion of the air induction duct 35, the shutters 36, 36 formed of a two-split plate-shaped member are provided to adjust the area of the opening 47 of the air induction duct 35. To adjust the area of the opening 47 of the air induction duct 35, finger hooks 52 each formed in a concave shape at an end of the upper surface of each of the shutters 36 are used, and the double-doored shutters 36, 36 are moved in a range of 0 to 100% of the area of the opening 47 so that the air intake amount is substantially equal to the exhaust amount. Also, in the air induction duct 35, an exhaust-duct-channel cross section is formed in a rectangular shape to ensure a channel cross-section larger than that when the exhaust-duct-channel cross section is formed in a circular shape with the same outer dimensions, thereby decreasing the size of the switching valve box 9.

Figure 9:
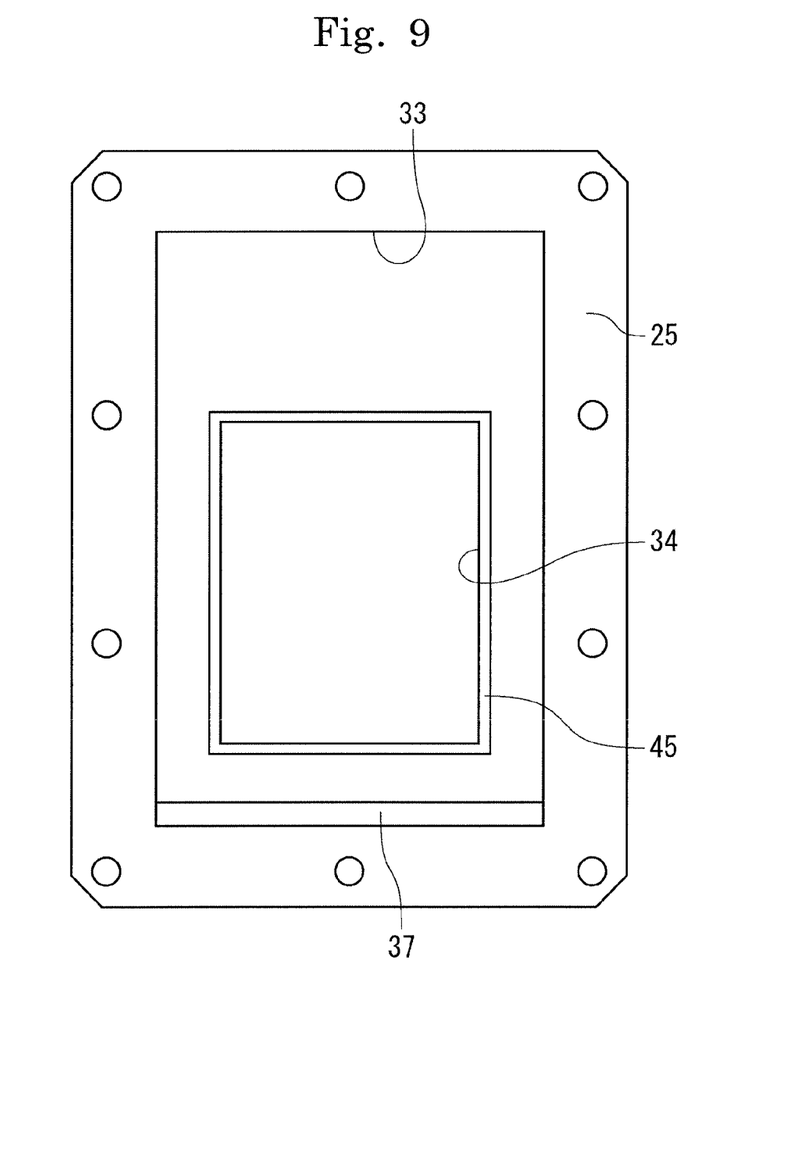
FIG. 9 is a side view depicting the state in which the inside of the switching valve box is viewed from a downstream side.

FIG. 9 depicts the state of the inside of the switching valve box 9 when viewed from a flange 25 side, with the switching valve 16, the air induction duct 35, and the mist traps 38, 39 removed therefrom. The exhaust duct 34 for introducing the exhaust 15 from the distribution box 8 to the inside of the box main body 33 of the switching valve box 9 is formed so as to have a channel cross section formed in a rectangular shape, thereby ensuring a larger channel cross section than a channel cross section formed in a circular shape with the same outer dimensions. Thus, compared with the case in which the channel cross section is formed in a circular shape, the exhaust switching device 7 with equivalent exhaust capability can be configured with more reduced size.

While the distribution box, the exhaust switching valve box, and the exhaust tube are formed of synthetic resin in the present embodiment, they can be formed by using a metal material such as a stainless steel, depending on the treatment fluids, use environment, etc.

Next, a configuring method and operation of the above-described treatment device are described.

To configure the treatment device, the exhaust switching device 20 is configured in advance by preparing a required number of exhaust switching units 3 and multilayering these units in a multistage state on the holding body 19 formed of an appropriate material.

One exhaust switching unit 3 is set by connecting the switching valve boxes 9 so as to correspond in number to treatment fluids in a parallel state in the distribution box 8 capable of connecting the switching valve boxes 9 so as to correspond in number to the types of treatment fluids for use in the treatment device and connecting the exhaust tube 12 to each of the switching valve boxes 9. For example, when treatment fluids of three types are used, one distribution box 8 with three connecting parts 14 and three switching valve boxes 9 are prepared, and the switching valve boxes 9 are connected to the distribution box 8. Next, after the switching units 3 are multilayered in a multistage state on the holding body 19, the exhaust tube 12 is mounted on the switching valve box 9 on the same row for exhaust of the same treatment fluid. After the exhaust switching units 3 are multilayered in a multistage state in the holding body 19, the exhaust tube 12 for exhaust of the same treatment fluid is connected to the end 11 of the switching valve box 9 on the same row to configure the exhaust switching device 20. Connection between the distribution box 8 and the switching valve boxes 9 and connection between the switching valve boxes 9 and the exhaust tube 12 can be easily made only by bolting the flanges provided to the respective connecting parts together. Note that "correspond to the types of treatment fluids" means not only that segmentation is made for each type of treatment fluid, such as an acidic chemical solution, an alkaline chemical solution, and an organic solvent fluid, but also that segmentation is made for each type of treatment fluid treatable in the same exhaust treatment facility. For example, when treatment fluids cannot be treated in the same exhaust treatment facility, such as an acidic chemical solution containing hydrofluoric acid and an acidic chemical solution not containing hydrofluoric acid, these treatment fluids are handled as different types even they are both acidic chemical solutions. When treatment fluids can be treated in the same exhaust treatment facility, such as a general acidic chemical solution and a general alkaline chemical solution, these treatment fluids are handled as the same type.

Thus configured exhaust switching device 20 is transported to a place near the treatment chambers 2 multilayered in a multistage state with a holding body similarly appropriate, and the exhaust pipe 4 of each treatment chamber 2 and the connecting part 13 of the distribution box 8 of the corresponding exhaust switching unit 3 are connected together, thereby completing the treatment device 1.

After the treatment device 1 is assembled, the degree of opening of the double-doored shutters 36, 36 provided on the upper portion of the air induction duct 35 is adjusted for each individual switching valve box 9 to adjust the exhaust amount and the induction air amount. This adjustment is performed by actually activating the exhaust system and checking an entire exhaust balance while measuring the exhaust amount and the induction air amount.

Also, if pressure fluctuations occur in the plurality of switching valve boxes 9 even though the degree of opening of the shutters 36, 36 of each switching valve box 9 is adjusted to make the exhaust amount and the induction air amount equal to each other, the rotary actuator 44 is adjusted for each individual switching valve box 9, and the swing angle of the switching valve 16 is slightly changed from substantially 90 degrees, thereby adjusting a gap between the switching valve 16 and the exit 45 or the exit 46 to, for example, 10 mm, 8 mm or 5 mm. With this, adjustment can be made so that pressure fluctuations inside the treatment chamber 2 are minimized.

In FIG. 1 and FIG. 2, when a treatment of cleaning a semiconductor wafer is performed inside the treatment chamber 2, the exhaust 15 from the treatment chamber 2 flows into the distribution box 8 connected to the exhaust pipe 4 of the treatment chamber 2. In FIG. 6, since the channel 29 communicating in a lateral direction is formed inside the distribution box 8, the exhaust 15 is distributed to every switching valve box 9 connected in a parallel state to the distribution box 8.

Here, for example, when it is assumed that a treatment of cleaning a semiconductor wafer with an acidic chemical solution is performed inside the treatment chamber 2 and, in FIG. 6, exhaust flows into the switching valve box 9 depicted in the uppermost stage, the switching valve 16 in each of the switching valve boxes 9 depicted in the intermediate and lower stages is positioned to close the exit 46 of the exhaust duct 34, and therefore the exhaust 15 cannot flow into the inside of the switching valve boxes 9 depicted in the intermediate and lower stages. Therefore, the exhaust 15 distributed in the distribution box 8 flows only into the switching valve box 9 depicted in the uppermost stage.

As depicted in FIG. 7, in the switching valve box 9 into which the exhaust 15 from the treatment chamber 2 is flowing, the switching valve 16 swings to an upper side by the rotary actuator 44, and is positioned to open the exit 45 of the exhaust duct 34 and close the exit 46 of the air induction duct 35. Also, gravity acts on the relief valves 18, which are positioned to close the air intake ports 51. The flow of the exhaust 15 flowing from the exhaust duct 34 into the inside of the box main body 33 of the switching valve box 9 is changed upward by the mist trap 38, thereby separating mist of the treatment fluid contained in the exhaust. The flow of the exhaust changed upward is discharged to the exhaust tube 12 connected to the end 11 of the switching valve box 9 on the downstream side while the flowing direction is changed by the switching valve 16 and the mist trap 39. Here, the channel area inside the box main body 33 to which the exhaust 15 flows is substantially equal to the channel area of the exhaust duct 34, and therefore no pressure drop occurs.

When the treatment of cleaning the semiconductor wafer with an acidic chemical solution inside the treatment chamber 2 ends and then a cleaning treatment with an alkaline chemical solution starts, the switching valve 16 of the switching valve box 9 of the exhaust system for the acidic chemical solution swings downward to a position to close the exit 45 of the exhaust duct 34, thereby opening the exit 46 of the air induction duct 35. On the other hand, since the exhaust tube 12 to which this exhaust switching valve box 9 is connected exhausts a constant exhaust amount, with the exit 45 of the exhaust duct 34 closed, the inside of the box main body 33 and the inside of the air induction box 49 in this switching valve box 9 become under negative pressure due to suction by the exhaust tube 12, and the relief valves 18, 18 open inwardly against the action of gravity by atmospheric pressure, thereby introducing the air 17 to the inside of the box main body 33 for discharge to the exhaust tube 12. By adjusting the opening of the shutters 36, 36 performed at the time of configuring the treatment device 1, the air intake amount is adjusted so as to be equal to the exhaust amount. Therefore, the exhaust flowing out from this switching valve box 9 and the amount of flow of intake air are equal to each other, and the exhaust discharged from this switching valve box 9 and the amount of flow of air are equal to each other and unchanged. Therefore, fluctuations in exhaust pressure inside other treatment chambers 2 communicating with the exhaust tube 12 connected to this switching valve box 9 can be inhibited. Thus, attachment of particles onto a treatment subject being treated in another treatment chamber 2 can be significantly decreased.

Also, the channel area of each of the intermediate channels 41 and 43 formed when the switching valve 16 swings downward to open the air induction duct 35 is larger than the channel area of each of the exhaust duct 34 and the air induction duct 35. Therefore, changes in the amount of flow inside the switching valve box 9 due to swing of the switching valve 16 are small, and fluctuations in exhaust pressure inside the treatment chamber 2 to which this switching valve box 9 is connected can be prevented.

When the treatment of cleaning the semiconductor wafer with the acidic chemical solution inside the treatment chamber 2 is performed again, the switching valve 16 of the switching valve box 9 which has been taking exhaust of the alkaline chemical solution so far swings upward by the rotary actuator 44 to close the exit 46 of the air induction duct 35. As a result, the negative pressure inside the air induction box 49 is resolved to stop air introduction and cause the atmospheric pressure not to act on the relief valves 18, 18. Therefore, the relief valves 18, 18 rotate to a position to close the air intake ports 51, 51 by the action of gravity. Since air is not introduced from the air induction duct 35, the negative pressure caused by the exhaust tube 12 is used to suction exhaust from the exhaust duct 34, and the exhaust 15 from the treatment chamber 2 is discharged via the inside of the switching valve box 9 to the exhaust tube 12.

Also, even if the switching valve 16 swings upward to open the exhaust induction duct 34, for the reason described above, changes in the amount of flow inside the switching valve box 9 due to swing of the switching valve 16 are small, and therefore fluctuations in exhaust pressure inside the treatment chamber 2 to which this switching valve box 9 is connected can be prevented.

Switching among the switching valves of the plurality of switching valve boxes when the treatment device is activated is performed in consideration of, by a sequencer or the like, opening/closing timing of the switching valve box taking exhaust and the switching valve box not taking exhaust and an entire exhaust balance.

In the above description, the treatment device for three systems for cleaning a semiconductor wafer by using treatment fluids of three types is described as an example. The present invention can also be applied to a treatment device for a plurality of systems other than three systems and a treatment device for a single system.

As has been described above, in the treatment device and exhaust switching device therefor, and exhaust switching unit and switching valve box according to the present invention, the exhaust line for one system is opened and closed with one switching valve, the exhaust amount and the air induction amount of the air-side relief valve are balanced, and fluctuations in pressure when the switching valve is activated can be reduced. When the number of systems is increased so as to correspond to the number of treatment fluids for use, a treatment device capable of reducing fluctuations in pressure inside the treatment chamber when the switching valve is activated can be obtained merely by arranging a plurality of individual exhaust pipes configured of standardized components in parallel. Therefore, its utility value is extremely high. Also, other than the exhaust-system treatment device of a semiconductor wafer manufacturing device described in the embodiment, the treatment device and exhaust switching device therefor, and exhaust switching unit and switching valve box according to the present invention can also be applied to, for example, an exhaust-system treatment device of a manufacturing device such as a liquid-crystal display device substrate or a plasma-display glass substrate.

DESCRIPTION OF REFERENCE NUMERALS 1 treatment device
2 treatment chamber
3 exhaust switching unit
7, 20 exhaust switching device
8 distribution box
9 switching valve box
12 exhaust pipe
16 switching valve
18 relief valve
34 exhaust duct
35 air induction duct
36 shutter
38, 39 mist trap

What is claimed is:
1. A treatment device, comprising:
a treatment chamber for treatment with treatment fluids of a plurality of types;
an exhaust switching unit formed of a distribution box, a plurality of switching valve boxes, and an exhaust tube; and
an exhaust pipe connected on one side to inside of the treatment chamber and connected on another side to the exhaust switching unit,
wherein
each of the switching valve boxes in the exhaust switching unit corresponds to one of the types of the treatment fluids,
the distribution box includes on one side a first connecting part connected to the exhaust pipe and on another side second connecting parts connected respectively to the plurality of switching valve boxes in a parallel state,
the distribution box is connected to the exhaust pipe by the first connecting part and connected to each of the switching valve boxes by the second connecting parts connected in the parallel state which are positioned in an exhaust direction thereof with respect to the one side,
the distribution box includes a channel between the first connecting part and the second connecting parts,
each of the switching valve boxes has an air induction duct on a portion of the switching valve box,
the air induction duct extends in a direction perpendicular to an exhaust direction of the switching valve box and includes an exit,
inside each of the switching valve boxes is an exhaust channel, and a switching valve,
the switching valve opens or closes the exhaust channel which purges an exhaust from the treatment chamber and the distribution box to the switching valve box,
the switching valve opens the air induction duct when closing the exhaust channel, and
the switching valve opens the exhaust channel when closing the air induction duct, and
the treatment device further comprises for each of the switching valve boxes an air intake port introducing air from outside the treatment device into the switching valve box, and a relief valve opening or closing the air intake port, and
wherein
the relief valve automatically opens the air intake port by a negative pressure due to suction created in the exhaust tube when closing the exhaust channel and by atmospheric pressure, and the relief valve automatically closes the air intake port by an action of gravity,
the treatment device further comprises for each of the switching valve boxes an air induction box connected to the switching valve box so as to cover the air induction duct,
the air intake port is provided on a side of the air induction box, and
the relief valve is a swing type valve, whose vertical upper side is mounted to the air induction box.

2. The treatment device according to claim 1, wherein the treatment device further comprises for each of the switching valve boxes a shutter which adjusts an opening area of the air induction duct, and
the relief valve is provided between the air intake port and the shutter.

3. The treatment device according to claim 2, wherein the structure of the shutter is a double-doored structure formed of two-split plate-shaped members, and
the two-split plate-shaped members are moved in a range of a close state to an open state so that the opening area is adjusted.

4. The treatment device according to claim 1, wherein each of the switching valve boxes includes a removable mist trap, and
the mist trap is positioned on a downstream side in an exhaust direction of the switching valve box with respect to the switching valve.

5. The treatment device according to claim 1, wherein each of the switching valve boxes forms an intermediate channel between a mist trap and the switching valve, and
a channel area of the intermediate channel is larger than that of the exhaust channel.

6. The treatment device according to claim 1, wherein the switching valve is rotated by a rotary actuator at substantially 90 degrees.

7. The treatment device according to claim 1, wherein
the treatment device further comprises a plurality of treatment chambers arranged in a multistage configuration,
a plurality of the exhaust pipes, and
a plurality of the exhaust switching units incorporated in the multistage configuration to configure an exhaust switching device, and
wherein
each of the exhaust pipes is connected to inside of a respective treatment chamber of the plurality of treatment chambers on one side and is connected to a respective exhaust switching unit of the plurality of exhaust switching units on another side, and
the exhaust tube for an exhaust of a treatment fluid of a corresponding type is connected to a switching valve box that is on a same row in the plurality of switching valve boxes arranged in the multistage configuration of the exhaust switching device.

8. A treatment device, comprising:
a treatment chamber for treatment with treatment fluids of a plurality of types;
an exhaust switching unit formed of a distribution box, a plurality of switching valve boxes, and an exhaust tube; and
an exhaust pipe connected on one side to inside of the treatment chamber and connected on another side to the exhaust switching unit,
wherein
each of the switching valve boxes in the exhaust switching unit corresponds to one of the types of the treatment fluids,
the distribution box includes on one side a first connecting part connected to the exhaust pipe and on another side second connecting parts connected respectively to the plurality of switching valve boxes in a parallel state,
the distribution box is connected to the exhaust pipe by the first connecting part and connected to each of the switching valve boxes by the second connecting parts connected in the parallel state which are positioned in an exhaust direction thereof with respect to the one side,
the distribution box includes a channel between the first connecting part and the second connecting parts,
each of the switching valve boxes has an air induction duct on a portion of the switching valve box,
the air induction duct extends in a direction perpendicular to an exhaust direction of the switching valve box and includes an exit,
inside each of the switching valve boxes is an exhaust channel, and a switching valve,
the switching valve opens or closes the exhaust channel which purges an exhaust from the treatment chamber and the distribution box to the switching valve box,
the switching valve opens the air induction duct when closing the exhaust channel, and
the switching valve opens the exhaust channel when closing the air induction duct,
wherein the treatment device further comprises for each of the switching valve boxes an air induction box provided on the portion of the switching valve box so as to cover the air induction duct,
an air intake port is provided on a side of the air induction box,
a relief valve is a swing type valve having a portion mounted so as to be rotatably attached to the air induction box, and
the air induction box has a cross sectional shape of an inverted trapezoidal shape so that the relief valve automatically closes the air intake port by the action of gravity.

9. The treatment device according to claim 8, wherein the air induction box is provided with a plurality of sets, each set formed of the relief valve and the air intake port.

* * * * *